(12) United States Patent
Okuno et al.

(10) Patent No.: US 9,647,115 B1
(45) Date of Patent: May 9, 2017

(54) SEMICONDUCTOR STRUCTURE WITH ENHANCED CONTACT AND METHOD OF MANUFACTURE THE SAME

(71) Applicant: TAIWAN SEMICONDUCTOR MANUFACTURING CO., LTD., Hsinchu (TW)

(72) Inventors: Yasutoshi Okuno, Hsinchu (TW); Cheng-Long Chen, Hsinchu (TW); Meng-Chun Chang, Taipei (TW); Sung-Li Wang, Hsinchu County (TW); Yi-Fang Pai, Hsinchu (TW); Yusuke Oniki, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/883,452

(22) Filed: Oct. 14, 2015

(51) Int. Cl.
| | |
|---|---|
| *H01L 29/66* | (2006.01) |
| *H01L 29/78* | (2006.01) |
| *H01L 29/161* | (2006.01) |
| *H01L 29/24* | (2006.01) |
| *H01L 29/165* | (2006.01) |
| *H01L 29/04* | (2006.01) |

(Continued)

(52) U.S. Cl.
CPC .... *H01L 29/7848* (2013.01); *H01L 21/76805* (2013.01); *H01L 21/76895* (2013.01); *H01L 23/535* (2013.01); *H01L 29/045* (2013.01); *H01L 29/161* (2013.01); *H01L 29/165* (2013.01); *H01L 29/24* (2013.01); *H01L 29/665* (2013.01); *H01L 29/66795* (2013.01); *H01L 29/7851* (2013.01)

(58) Field of Classification Search
CPC ........... H01L 29/785; H01L 2029/7858; H01L 21/845; H01L 27/0886; H01L 27/0924; H01L 27/1211; H01L 29/165; H01L 29/161; H01L 29/66795; H01L 29/665
See application file for complete search history.

(56) References Cited

U.S. PATENT DOCUMENTS

| | | | | |
|---|---|---|---|---|
| 2013/0154002 | A1* | 6/2013 | Kuo | ............... H01L 29/66795 257/347 |
| 2014/0151761 | A1* | 6/2014 | Hsieh | ............... H01L 29/66545 257/288 |

(Continued)

OTHER PUBLICATIONS

Loup et al.,Silicon and SiGe alloys wet etching using TMAH chemistry, 2013, $224^{th}$ ECS Meeting, @2013 The Electrochemical Society.*

*Primary Examiner* — Reema Patel
*Assistant Examiner* — Syed Gheyas
(74) *Attorney, Agent, or Firm* — Maschoff Brennan (57) ABSTRACT

A method of forming a semiconductor structure includes the following operations: (i) forming a fin structure on a substrate; (ii) epitaxially growing an epitaxy structure from the fin structure; (iii) forming a sacrificial structure surrounding the epitaxy structure; (iv) forming a dielectric layer covering the sacrificial structure; (v) forming an opening passing through the dielectric layer to partially expose the sacrificial structure; (vi) removing a portion of the sacrificial structure to expose a portion of the epitaxy structure; and (vii) forming a contact structure in contact with the exposed portion of the epitaxy structure. A semiconductor structure is disclosed herein as well.

20 Claims, 7 Drawing Sheets (51) Int. Cl.
*H01L 23/535* (2006.01)
*H01L 21/768* (2006.01)

(56) References Cited

U.S. PATENT DOCUMENTS

| | | | | |
|---|---|---|---|---|
| 2015/0069473 A1* | 3/2015 | Glass | ............... | H01L 21/02175 |
| | | | | 257/288 |
| 2015/0333145 A1* | 11/2015 | Chudzik | ........... | H01L 29/66795 |
| | | | | 257/401 |
| 2016/0099342 A1* | 4/2016 | Basker | ............... | H01L 27/0924 |
| | | | | 438/283 |

\* cited by examiner

SEMICONDUCTOR STRUCTURE WITH ENHANCED CONTACT AND METHOD OF MANUFACTURE THE SAME

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance, and a variety of challenges from fabrication and design have led semiconductor technologies to three-dimensional designs, such as fin-like field effect transistors (FinFETs). A typical FinFET is fabricated with a thin "fin" extending on a substrate. The channel of the FinFET is formed in the fin. In addition, a gate is formed to traverse the fin, and therefore a tri-gate structure is fabricated. It is beneficial to have a gate on three sides of the channel that allows the gate to control the channel from several sides. FinFET devices further include strained source/drain features to enhance carrier mobility and improve device performance. However, as device scaling down continues, conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The semiconductor industry has continually improved the speed and power of integrated circuits (ICs) by reducing the size of components within the ICs. Several advanced techniques have been developed to implement technique nodes with smaller feature sizes. However, while the feature size is smaller than a certain dimension, the contact areas of the source/drain regions are decreased, and that degrades device performance and decreases the manufacture yield. Accordingly, one of the aspects of the present disclosure is to provide a solution to the problems associated with the minute contact areas.

The present disclosure relates generally to a semiconductor structure such as for example source/drain contact structure, and a method of forming the semiconductor structure. According to some embodiments of the present disclosure, the semiconductor structure and the method of fabricating the semiconductor structure provides improved contact characteristics, satisfactory process window and reduced parasitic capacitances. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
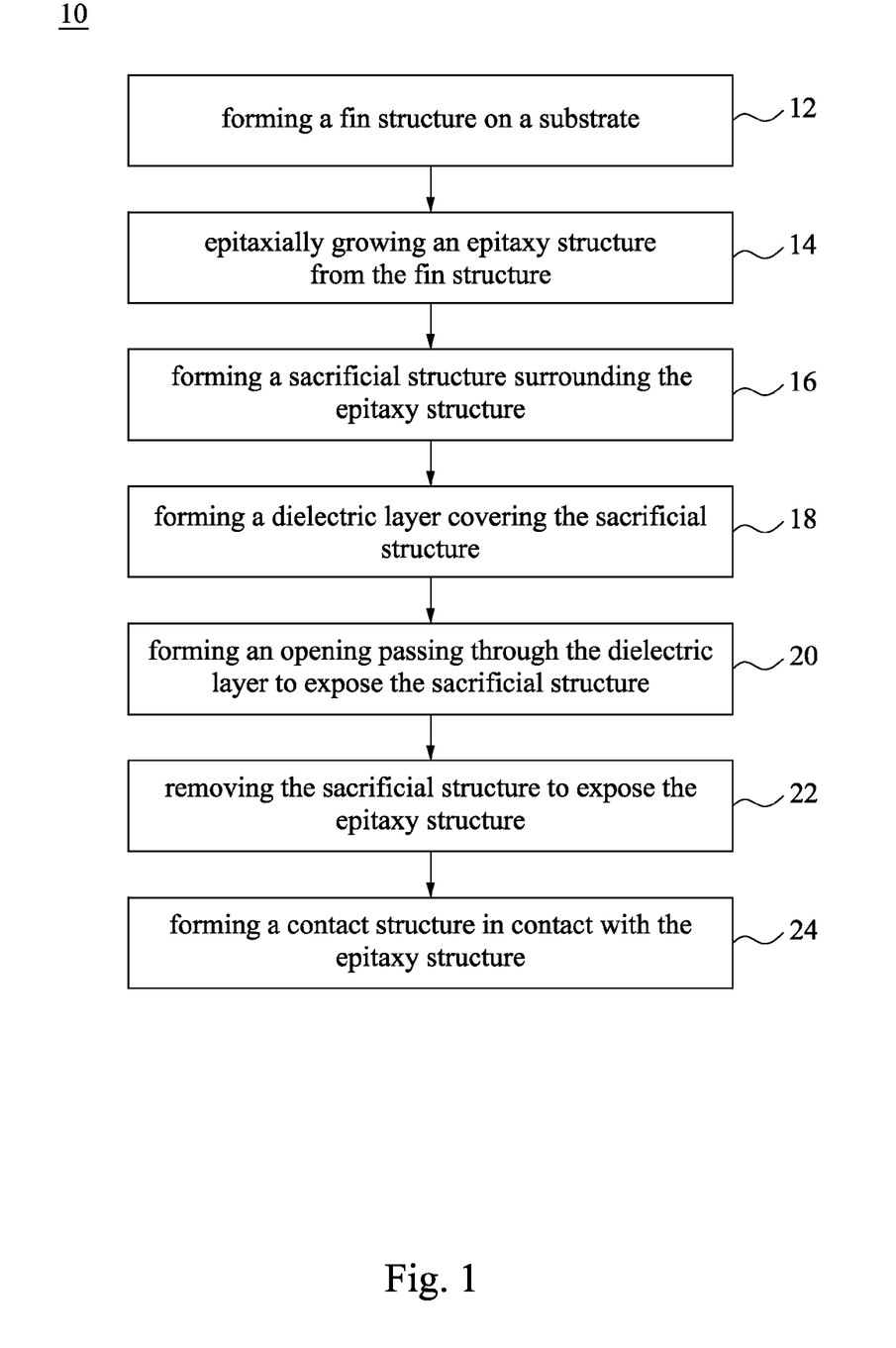
FIG. 1 is a flow chart illustrating a method of forming a semiconductor structure according to various embodiments of the present disclosure.

FIG. 1 is a flowchart illustrating a method 10 of forming a semiconductor structure according to various embodiments of the present disclosure. The method 10 includes operations 12, 14, 16, 18, 20, 22 and 24. FIGS. 2-5 and 7 are various diagrammatic cross-sectional views, in portion or entirety, at various stages of fabrication according to the method 10 of FIG. 1. Further, FIG. 6 is a schematic top view associated with FIG. 5. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 2:
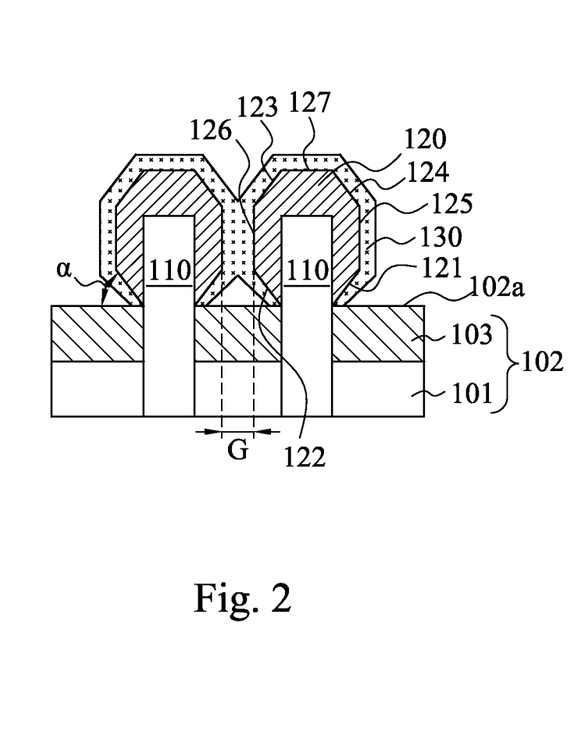
FIGS. 2-5 and 7 are schematic cross-sectional views at various stages of forming a semiconductor structure according to various embodiments of the present disclosure.

Referring to the operation 12 of FIG. 1, one or more fin structures 110 are formed on a substrate 102, as depicted in FIG. 2. In various embodiments, the substrate 102 may include a semiconductor substrate 101. The semiconductor substrate 101, for example, may include silicon. In some embodiments, the semiconductor substrate 101 may include other elementary semiconductor such as for example germanium. In yet some embodiments, the semiconductor substrate 101 may include an alloy semiconductor such as for example silicon germanium, silicon germanium carbide, gallium indium phosphide and the like. In yet some embodiments, the semiconductor substrate 101 may include compound semiconductor such as for example gallium arsenic, silicon carbide, indium phosphide, indium arsenide and the like. In yet some embodiments, the semiconductor substrate 101 may include a semiconductor-on-insulator (SSOI) structure. In yet some embodiments, the semiconductor substrate 101 may include an epitaxial layer overlying a bulk semiconductor material. Further, the semiconductor substrate 101 may include any suitable crystallographic orientation such as for example a (100), (111), or (110) crystallographic orientation. In examples, the semiconductor substrate 101 includes silicon with a top surface having a (100) crystalline orientation.

In some embodiments, the fin structure(s) 110 may include a portion of the semiconductor substrate 101. In order to form the fin structure(s) 110, the semiconductor substrate 101 may be etched to form a number of trenches using suitable processes such as for example typical lithography processes and/or double patterning lithography (DPL) processes. Examples of the etching process include medium-density plasma etch techniques or high-density plasma etch techniques utilizing inductive, helicon, or electron cyclotron resonance (ECR) plasmas, or other suitable etch techniques such as for example reactive ion etching (RIE) processes. The obtained trenches define the fin structure(s) 110 and the location of the isolation feature 103. In some examples, the height of each fin structure 110 is about fifty nanometers to hundreds of nanometers.

In yet some embodiments, the substrate 102 may further include an isolation feature 103 on the semiconductor substrate 101. The fin structures protrude out of the isolation feature 103. The isolation feature 103 may be formed by depositing a dielectric material filling the trenches, and subsequently the excess deposited dielectric material is removed. Illustrated techniques for depositing the dielectric material include, but are not limited to, chemical vapor deposition (CVD) processes, high density plasma (HDP) CVD processes, sub-atmospheric pressure CVD (SACVD) processes, spin-on dielectric (SOD) processes, and other suitable deposition techniques. The dielectric material of the isolation feature 103 may include silicon oxide, silicon nitride, low dielectric constant (low k) materials, or any combination thereof, or the like. Illustrated low k materials include fluorinated silica glass (FSG), bis-benzocyclobuteues (BCB), carbon doped silicon oxide, amorphous fluorinated carbon, polyimide, Parylene™, and/or other materials. In some examples, the excess deposited dielectric material may be removed by a chemical-mechanical polishing (CMP) process, and/or an etching process. In yet some examples, the isolation feature 103 may be a shallow trench isolation (STI).

In yet some embodiments, a gate structure such as gate structure 160 shown in FIG. 6 may be formed over a portion of the fin structure(s) 110. The gate structure traverses the fin structure(s) 110. Either the "gate first process" or the "gate last process" may be employed to form the gate of devices according to various embodiments of the present disclosure. Further, the gate structure may include several features such as for example electrode layers, spacers, dielectric layers, diffusion/barrier layers, interfacial layers, capping layers, other suitable layers, and/or combinations thereof. For example, the gate structure may have a gate dielectric, a gate electrode and spacers positioned on each side of the gate structure. The gate dielectric may include a dielectric material such as for example high-k dielectric material, silicon oxide, silicon nitride, other suitable dielectric material, and/or combinations thereof. Examples of the high-k dielectric material include $HfO_2$, HfTaO, HfTiO, HfSiO, HfSiON, HfZrO, aluminum oxide, other suitable high-k dielectric materials, and/or combinations thereof. The gate electrode may include any suitable material such as for example polysilicon, copper, aluminum, tantalum, titanium, tungsten, cobalt silicide, nickel silicide, TiN, TaN, TiAl, TiAlN, TaCN, TaC, TaSiN, metal alloys, other suitable materials, and/or combinations thereof.

In yet some embodiments, various doped region, such as source and drain regions, may be formed in the fin structure(s) 110. The source and drain regions may include lightly doped regions and/or heavily doped regions. The gate structure traversing the fin structures may separate the various doped regions. For example, the gate structure may separate a source region and a drain region of each fin structure 110. The doping species depend on the type of device being fabricated, such as for example an NMOS or PMOS device. The doping species include p-type dopants such as for example boron or $BF_2$, or n-type dopants such as for example phosphorus or arsenic. The doped regions may be formed by implantation processes, diffusion process, and/or other suitable processes.

The fin structure(s) 110 may include a p-type semiconductor or an n-type semiconductor according to various embodiments of the present disclosure. In the following description in connection with FIGS. 2-7, the fin structures are illustrated as a p-type semiconductor. On the other hand, FIGS. 8-12 illustrates the method associated with an n-type fin structure(s).

In the operation 14 of FIG. 1, one or more epitaxy structures 120 are epitaxially grown from the fin structure(s) 110, as depicted in FIG. 2. In some embodiment, each of the epitaxy structures 120 cover a corresponding one of the fin structures 110, and two adjacent epitaxy structures 120 are spaced apart from each other by a gap G. In some examples, gap G is about 3 nm to about 30 nm, specifically about 3 nm to about 15 nm, more specifically about 3 nm to about 10 nm. In various embodiments, the operation of epitaxially growing the epitaxy structure 120 may include an act of epitaxially growing a silicon germanium (SiGe) epitaxy structure, which has a germanium (Ge) molar percentage ranged from about 20% to about 80%, specifically about 40% to about 80%, more specifically about 50% to about 80%. In some embodiments, each of the epitaxy structure 120 has a first facet 121, a second facet 122, a third facet 123 and a fourth facet 124, in which each of the first, second, third and fourth facets 121, 122, 123, 124 has a (111) crystalline orientation. Additionally, the first and second facets 121, 122 adjoin a principal surface 102a of the substrate 102. In some embodiments, each of the first and second facets 121, 122 forms an acute angle α with the principal surface 102a of the semiconductor substrate 102. In examples, the angle α is about 35 degrees to about 70 degrees. The epitaxy structure 120 further has a fifth facet 125 and a sixth facet 126 each having a (110) crystalline orientation. The epitaxy structure 120 further has seventh facet with a (100) crystalline orientation on the top of the epitaxy structure 120. In some embodiments, the thickness of the epitaxy structure 120 may range from about 2 nm to about 30 nm, specifically about 2 nm to about 15 nm, more specifically about 3 nm to about 10 nm. In some embodiments, the epitaxially grown process may use molecular beam epitaxy, vapor-phase epitaxy (VPE), ultra-high vacuum CVD (UHV-CVD)) or other suitable techniques. In some examples, the epitaxially grown may use precursors which interact with the composition of the fin structure 110. For example, the precursors interact with silicon of the fin structure(s) 110.

In the operation 16, a sacrificial structure 130 is formed to surround the epitaxy structure 120. The material composition of the sacrificial structure 130 is different from that of the epitaxy structure 120.

In some embodiments, the operation of forming the sacrificial structure 130 includes epitaxially growing a SiGe epitaxy structure having a Ge molar percentage less than the Ge molar percentage of the epitaxy structure 120. In some examples, the difference between the epitaxy structure 120 and the sacrificial structure 130 in Ge molar percentage is greater than about 10%, specifically greater than about 20%, more specifically greater than about 30%. For example, the Ge molar percentage of the epitaxy structure 120 may be about 50% to about 80%, whereas the Ge molar percentage of the sacrificial structure 130 may be about 40% to about 70%, or about 30% to about 60%, or about 20% to about 50%. In yet some examples, the epitaxy structure(s) 120 may include Ge-rich SiGe material, whereas the sacrificial structure 130 may include Si-rich SiGe material. In yet some examples, the operation of forming the sacrificial structure 130 includes epitaxially growing a silicon epitaxy structure which does not include germanium. The difference in the Ge molar percentage between the epitaxy structure 120 and the sacrificial structure 130 allows the sacrificial structure 130 to be removed in the subsequent process while the epitaxy structure 120 is remained.

In some embodiments, the sacrificial structure 130 may be formed by epitaxially grown processes such as for example molecular beam epitaxy techniques, vapor-phase epitaxy (VPE) techniques, ultra-high vacuum CVD techniques (UHV-CVD)) or other suitable techniques. In examples, the epitaxially grown processes may use precursors which interact with the composition of the epitaxy structure 120. In some embodiments, the thickness of the sacrificial structure 130 may range from about 3 nm to about 50 nm, specifically about 4 nm to about 40 nm, more specifically about 5 nm to about 30 nm.

In some embodiments, the sacrificial structure 130 surrounds the epitaxy structures 120 and fills in the gap G between two adjacent epitaxy structures 120. Stated differently, the sacrificial structure 130 may be epitaxially grown from each epitaxy structure 120, and finally two adjacent epitaxy portions in the gap G are merged together to form the sacrificial structure 130 as depicted in FIG. 2.

Figure 3:
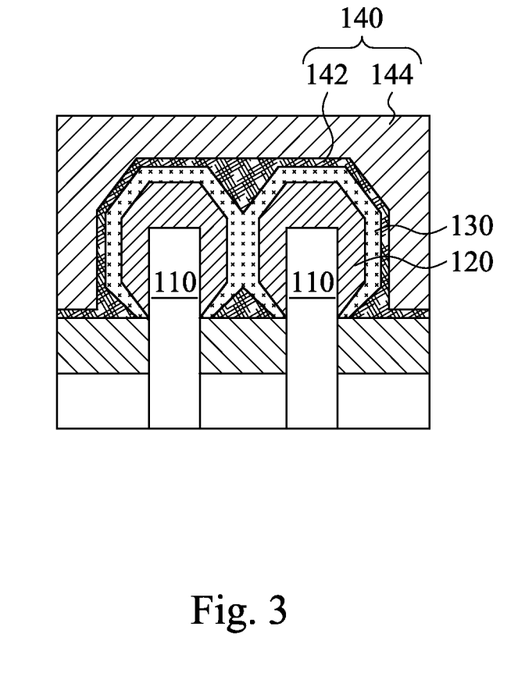

In the operation 18, a dielectric layer 140 is formed to cover the sacrificial structure 130, as depicted in FIG. 3. In some embodiments, the dielectric layer 140 includes a contact etching stop layer (CESL) 142 and an interlayer dielectric (ILD) layer 144. Specifically, the CESL 142 may be deposited on the sacrificial structure 130, and followed by the deposition of the ILD layer 144. The CESL 142 surrounds and contacts the sacrificial structure 130. In some examples, the CESL 142 may include silicon nitride, silicon oxide or SiON, or the like. In yet some examples, the ILD layer 144 may be formed of a low dielectric constant (low-k) dielectric material, such as phosphosilicate glass (PSG), borophosphosilicate glass (BPSG), fluorinated silicate glass (FSG), silicon carbon material, composites thereof, combinations thereof, or the like. The CESL 142 and the ILD layer 144 may be formed by any suitable approaches, such as spinning coating, chemical vapor deposition (CVD), and/or plasma-enhanced CVD (PECVD) or other deposition techniques. In some embodiments, the operation of forming the dielectric layer 140 includes an act of performing a chemical-mechanical polishing (CMP) process on the deposited ILD layer 144.

Figure 4:
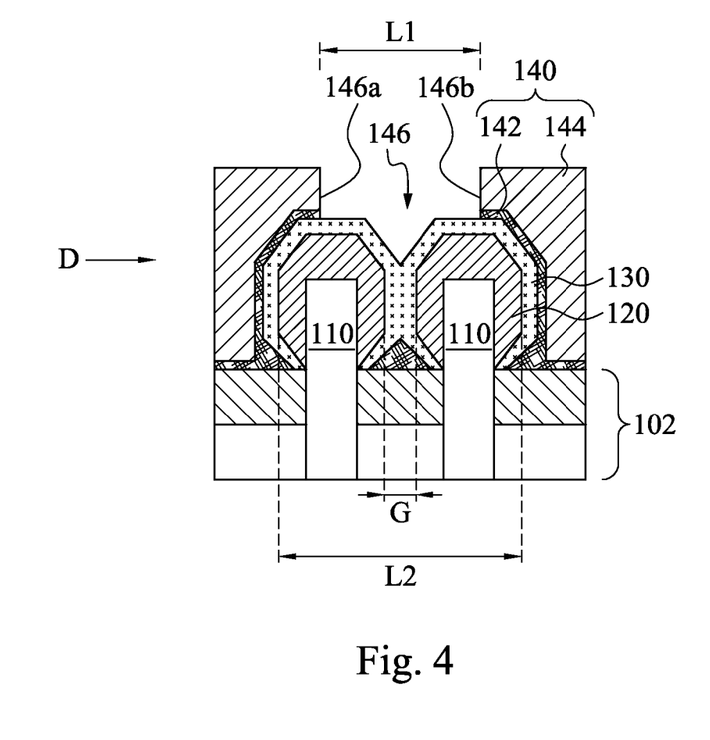

In the operation 20, an opening 146 passing through the dielectric layer 140 is formed to partially expose the sacrificial structure 130, as illustrated in FIG. 4. In various embodiments, the opening 146 is aligned with the source and/or drain regions of the fin structure(s) 110. In some embodiments, the opening 146 traverses a plurality of epitaxy structures 120, and exposes the portion of the sacrificial structure 130 filled in the gap G. In yet some embodiments, the sacrificial structure 130 extends a length L2 in a direction D traversing the fin structures 110. Further, the opening 146 has a length L1 that is less than the traversing length L2 of the sacrificial structure 130. In yet some embodiments, the edge 146a and edge 146b of the opening 146 are respectively aligned with two different epitaxy structures 120. The opening 146 may be formed by any suitable etching approaches such as for example high-density plasma etch techniques utilizing inductive, helicon, or electron cyclotron resonance (ECR) plasmas, reactive ion etching (RIE) processes and/or other suitable etching techniques.

The sacrificial structure 130 advantageously prevents the fin structure 110 and the epitaxy structure 120 from damage in the operation of forming the opening 146. In addition, the aspect ratio of the opening 146 is reduced because of the formation of the sacrificial structure 130, and therefore the etching process used to form the opening 146 may be modulated to a moderate condition, and thereby increasing the process window. Accordingly, the fin structure 110 and the epitaxy structure 120 may be secured due to the formation of the sacrificial structure 130.

Figure 5:
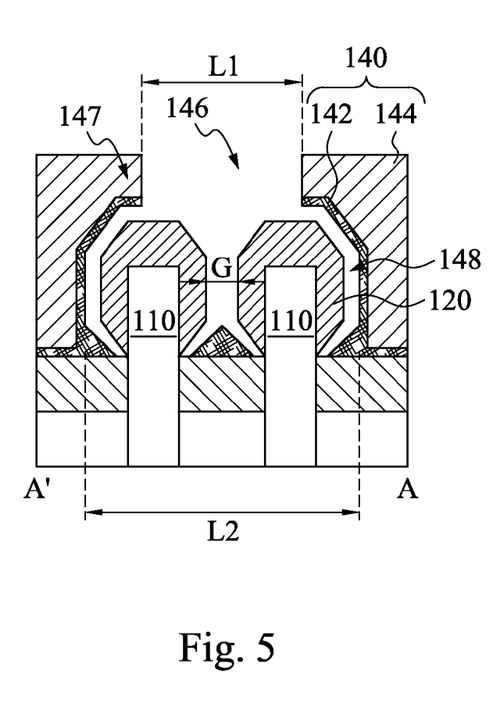
Figure 6:
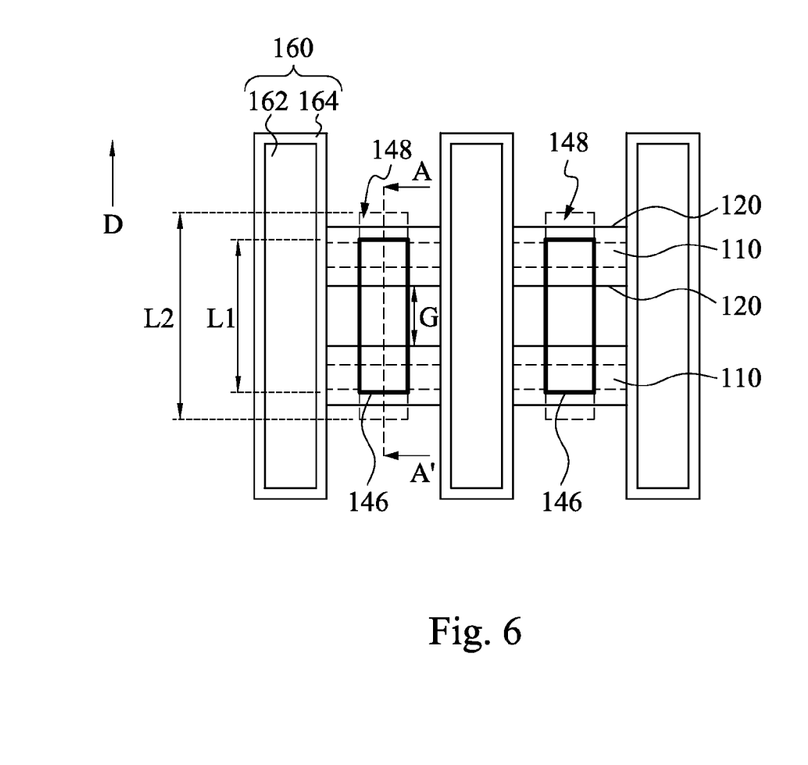
FIG. 6 is a schematic top view associated with FIG. 5.

In the operation 22, at least a portion of the sacrificial structure 130 is removed such that a portion of the epitaxy structure 120 is exposed, as illustrated in FIG. 5. FIG. 6 is a top view schematically illustrating the structure depicted in FIG. 5 which is taken along line AA' in FIG. 6. When the sacrificial structure 130 is removed, a void space 148 is created in the dielectric layer 140. In some embodiments, the contour of the void space 148 is substantially defined by the shapes of the sacrificial structure 130 and the opening 146, so that the void space 148 may includes at least a portion of the gap G between adjacent epitaxy structures 120, and the space between the dielectric layer 140 and the epitaxy structures 120. The void space 148 communicates with the opening 146. In some embodiments, as shown in FIG. 5, an overhanging portion 147 is formed in the dielectric layer 140, and the overhanging portion 147 adjoins the opening 146. In yet some embodiments, the traversing length L2 of the sacrificial structure 130 is substantially equal to a lateral length of the void space 148, which is greater than the length L1 of the opening 146. In yet some embodiments, with reference to FIG. 6, one or more gate structures 160 may be fabricated on the substrate 102 before the operation 22 is carried out, either using the "gate first process" or the "gate last process". Each of the gate structures 160 extends in the direction D and traverses the fin structures 110. Additionally, each gate structure 160 includes a gate electrode 162 and a gate spacer 164 positioned on each side of the gate electrode 162. In yet some embodiments, a plurality of the openings 146 are formed, and the openings 146 extend in the direction D and traverse the fin structures 110 and the epitaxy structures 120 formed thereon.

In yet some embodiments, the operation 22 of removing the sacrificial structure 130 includes performing a wet etching process. The etchant used in the wet etching process exhibits a high etching selectivity ratio of the sacrificial structure 130 to the epitaxy structure 120 so that most of the epitaxy structure 120 is remained. Examples of the etchants include tetramethylammonium hydroxide (TMAH) solution, ammonia-hydrogen peroxide-water (APM) solution and the like.

According to some embodiments of the present disclosure, the sacrificial structure 130 includes silicon or Si-rich SiGe, whereas the epitaxy structure 120 includes Ge-rich SiGe. The difference in the Ge concentration between the epitaxy structure 120 and the sacrificial structure 130 allows the sacrificial structure 130 to be removed while the epitaxy structure 120 is remained. In some examples, the difference in Ge molar percentage between the epitaxy structure 120 and the sacrificial structure 130 is greater than about 10%, specifically greater than about 20%, more specifically greater than about 30%.

Figure 7:
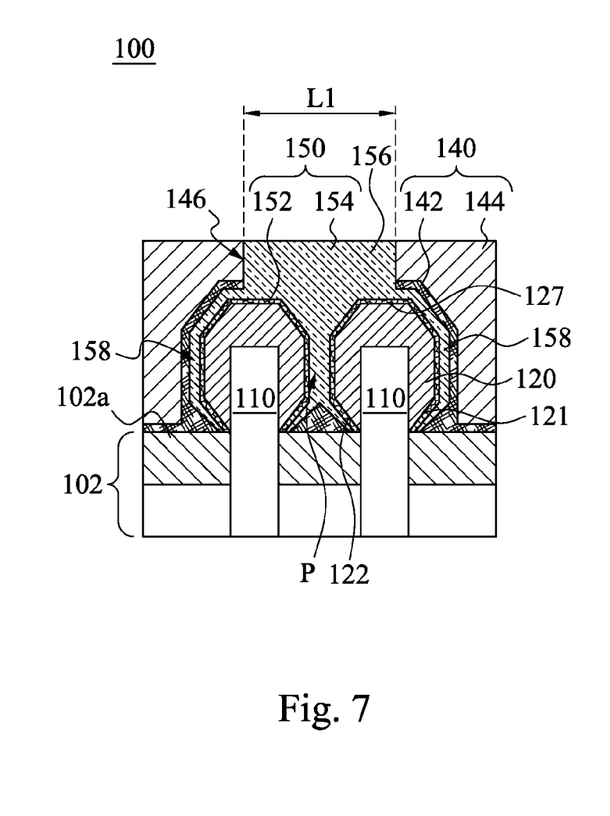

In the operation 24 of FIG. 1, a contact structure 150 is formed on the exposed portion of epitaxy structure 120, as illustrated in FIG. 7. Specifically, the contact structure 150 fills in the opening 146 and the space 148, and is in contact with the epitaxy structure(s) 120. In some embodiments, the contact structure 150 includes a number of silicide features (e.g., silicide layers) 152 and a conductive structure 154. Each silicide feature 152 is disposed on a corresponding epitaxy structure 120. The conductive structure 154 is filled in the opening 146 and in contact with the silicide features 120. In specifics, the contact structure 150 may be fabricated by the following acts: (i) performing a silicidation process to form a plurality of silicide features 152 each covering the exposed portion of a corresponding one of the epitaxy structures 120, in which two adjacent silicide features 152 are spaced apart from each other by an aperture P; and (ii) depositing the conductive structure 154 in the opening 146 and the aperture.

In some embodiments, silicidation processes may increase the conductivity of epitaxy structures 120. In silicidation, a metal layer is deposited on surfaces of the epitaxy structures 120 and then annealed according to some examples of the present disclosure. The underlying epitaxy structures including silicon may react with the metal layer to produce a silicide layer. The silicided regions have lower resistance than non-silicided regions, and hence improve conductivity.

In some examples, the silicide feature 152 includes SiNi, SiCo, or other suitable materials and/or combinations thereof. In some examples, the conductive structure 154 includes tungsten, copper, aluminum, tantalum, titanium, TiN, TaN, TiAl, TiAlN, TaCN, TaC, metal alloys, other suitable materials, and/or combinations thereof.

According to various embodiments of the present disclosure, the contact structure 150 includes a trunk portion 156, a plurality of branch portions 158 and the silicide features 152.

In some embodiments, each of the silicide features 152 covers a top surface of each epitaxy structure 120, such as the seventh facet 127, and further extends to the first and second facets 121, 122 of the epitaxy structure 120. In some examples, the silicide features 152 may encompass the periphery of the exposed portions of the epitaxy structures 120 in the space 148 (indicated in FIG. 5). Therefore, the contact area between the epitaxy structures 120 and the silicide features 152 may be advantageously increased.

In some embodiments, the trunk portion 156 fills the opening 146, and thereby the length of the trunk portion 156 is substantially equal to the length L1 of the opening 148. Advantageously, the parasitic captaincy between the contact structure 150 and the gate structure 160 (indicated in FIG. 6) may be decreased because the length of the trunk portion 156 is decreased, as compared to conventional techniques.

In some embodiments, the branch portions 158 extend from the trunk portion 156 and fill the space 148. The branch portions 158 further cap the silicide features 152. In some examples, the branch portions 158 enclose the silicide features 152, and thereby providing an enlarged contact area between the silicide features 152 and the branch portions 158 of the contact structure 150.

FIG. 8-12 are schematic cross-sectional view at various stages of forming a semiconductor structure according to various embodiments of the present disclosure, in which the fin structure includes n-type semiconductor material.

Figure 8:
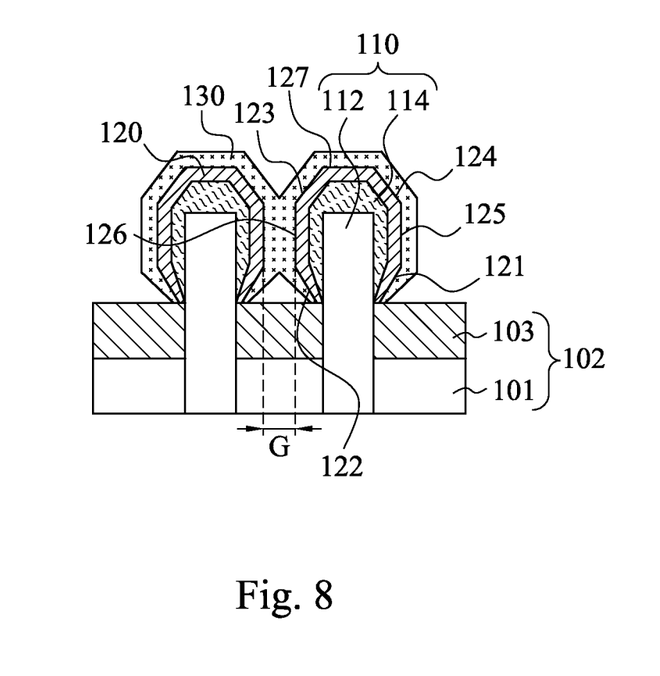
FIG. 8-12 are schematic cross-sectional view at various stages of forming a semiconductor structure according to various embodiments of the present disclosure

In FIG. 8, one or more fin structures 110 including n-type semiconductor material are formed on a substrate 102. In some embodiments, each fin structure 110 includes an N-type fin 112 and a silicon phosphorus (SiP) layer 114. The N-type fin 112 includes N-type semiconductor material. In some examples, the SiP layer 114 may be epitaxially grown from the N-type fin 112, so that the SiP layer 114 covers the exposed surface of the N-type fin 112.

Thereafter, one or more epitaxy structures 120 are epitaxially grown from the fin structures 110, for example epitaxially grown from the SiP layer 114. In some embodiment, each of the epitaxy structures 120 cover a corresponding one of the fin structures 110, and two adjacent epitaxy structures 120 are spaced apart from each other by a gap G. In various embodiments, the operation of epitaxially growing the epitaxy structure 120 may include an act of epitaxially growing a silicon germanium phosphorus (SiGeP) epitaxy structure, which has a germanium (Ge) molar percentage greater than about 10%. In some embodiments, the Ge molar percentage in the SiGeP epitaxy structure is ranged from about 10% to about 80%, specifically about 20% to about 80%, more specifically about 50% to about 80%. In some embodiments, each of the epitaxy structure 120 has a first facet 121, a second facet 122, a third facet 123 and a fourth facet 124, in which each of the first, second, third and fourth facets 121, 122, 123, 124 has a (111) crystalline orientation. Additionally, the first and second facets 121, 122 adjoin a principal surface 102a of the substrate 102. The epitaxy structure 120 further has a fifth facet 125 and a sixth facet 126 each having a (110) crystalline orientation. The epitaxy structure 120 further has seventh facet with a (100) crystalline orientation on the top of the epitaxy structure 120. In some embodiments, the thickness of the epitaxy structure 120 may range from about 2 nm to about 30 nm, specifically about 2 nm to about 15 nm, more specifically about 3 nm to about 10 nm. In some embodiments, the epitaxially grown process may use molecular beam epitaxy, vapor-phase epitaxy (VPE), ultra-high vacuum CVD (UHV-CVD)) or other suitable techniques. In some examples, the epitaxially grown may use precursors which interact with the composition of the fin structure 110. For example, the precursors interact with silicon of the fin structure(s) 110.

A sacrificial structure 130 is subsequently formed surrounding the epitaxy structure 120. The material composition of the sacrificial structure 130 is different from that of the epitaxy structure 120.

In some embodiments, the operation of forming the sacrificial structure 130 includes epitaxially growing a silicon germanium (SiGe) epitaxy structure having a Ge molar percentage less than the Ge molar percentage of the epitaxy structure 120. In some examples, the difference in Ge molar percentage between the epitaxy structure 120 and the sacrificial structure 130 is greater than about 10%, specifically greater than about 15%, more specifically greater than about 20%. For example, the Ge molar percentage of the epitaxy structure 120 may be about 50% to about 80%, whereas the Ge molar percentage of the sacrificial structure 130 may be about 40% to about 70%, or about 30% to about 60%, or about 20% to about 50%. In yet some examples, the epitaxy structure(s) 120 may include Ge-rich SiGeP material, whereas the sacrificial structure 130 may include Si-rich SiGe material. In yet some examples, the operation of forming the sacrificial structure 130 includes epitaxially growing a silicon epitaxy structure which does not include germanium. The difference in the Ge molar percentage between the epitaxy structure 120 and the sacrificial structure 130 allows the sacrificial structure 130 to be removed in the subsequent process while the epitaxy structure 120 is remained.

In some embodiments, the sacrificial structure 130 surrounds the epitaxy structures 120 and fills in the gap G between two adjacent epitaxy structures 120. Stated differently, the sacrificial structure 130 may be epitaxially grown from each epitaxy structure 120, and finally two adjacent epitaxy portions in the gap G are merged together to form the sacrificial structure 130 as depicted in FIG. 8.

Figure 9:
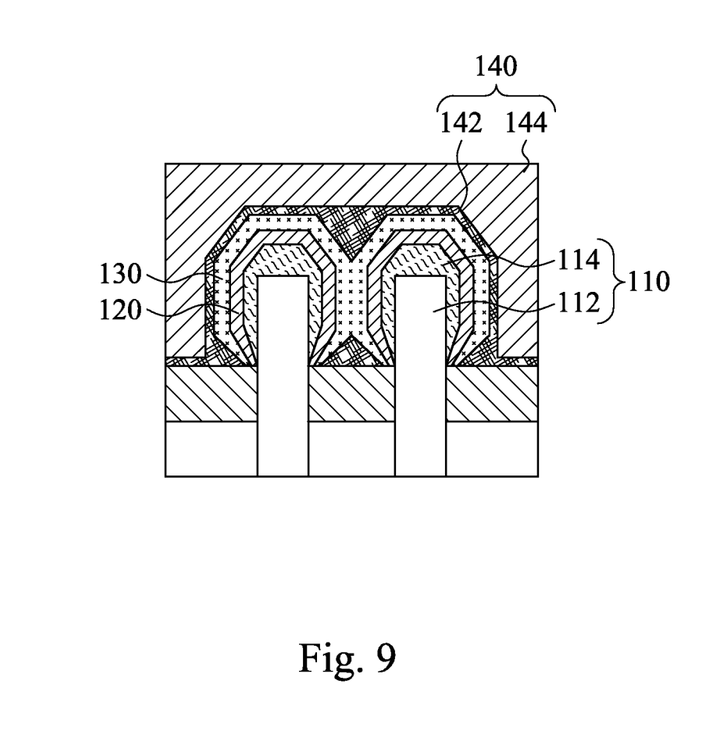

In FIG. 9, a dielectric layer 140 is formed to cover the sacrificial structure 130. In some embodiments, the dielectric layer 140 includes a contact etching stop layer (CESL) 142 and an ILD layer 144. Specifically, the CESL 142 may be deposited on the sacrificial structure 130, and followed by the deposition of the ILD layer 144. The CESL 142 surrounds and contacts the sacrificial structure 130.

Figure 10:
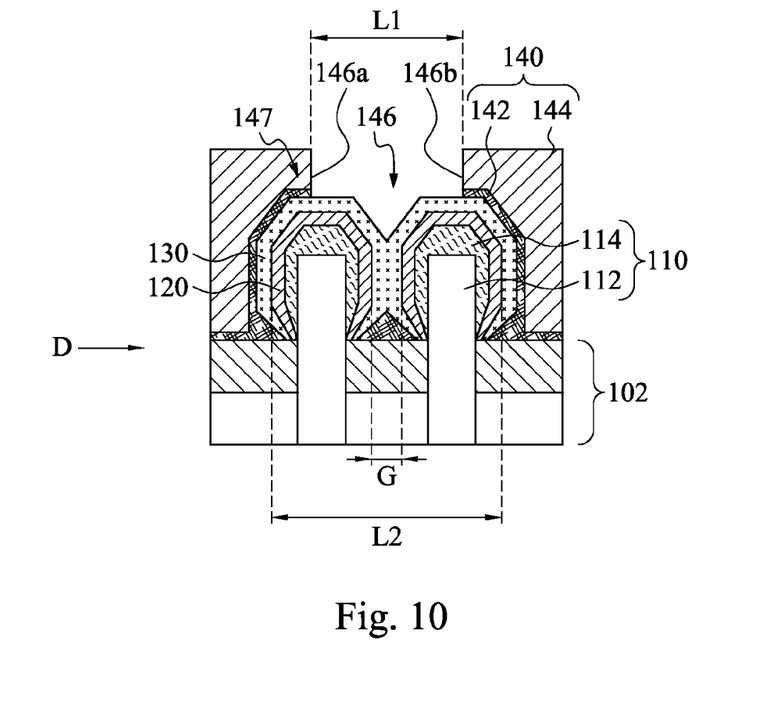

In FIG. 10, an opening 146 passing through the dielectric layer 140 is formed to partially expose the sacrificial structure 130, as illustrated in FIG. 4. In various embodiments, the opening 146 is aligned with the source or drain regions of the fin structure(s) 110. In some embodiments, the opening 146 traverses a plurality of epitaxy structures 120, and exposes the portion of the sacrificial structure 130 filled in the gap G. In yet some embodiments, the sacrificial structure 130 extends a length L2 in a direction D traversing the fin structures 110. Further, the opening 146 has a length L1 that is less than the traversing length L2 of the sacrificial structure 130. In yet some embodiments, the edge 146a and edge 146b of the opening 146 are respectively aligned with two different epitaxy structures 120. The opening 146 may be formed by any suitable etching approaches such as for example high-density plasma etch techniques utilizing inductive, helicon, or electron cyclotron resonance (ECR) plasmas, reactive ion etching (RIE) processes and other suitable etching techniques.

The sacrificial structure 130 advantageously prevents the fin structure 110 and the epitaxy structure 120 from damage in the operation of forming the opening 146. In addition, the aspect ratio of the opening 146 is reduced because of the formation of the sacrificial structure 130, and therefore the etching process used to form the opening 146 may be modulated to a moderate condition. Accordingly, the fin structure 110 and the epitaxy structure 120 are secured due to the formation of the sacrificial structure 130.

Figure 11:
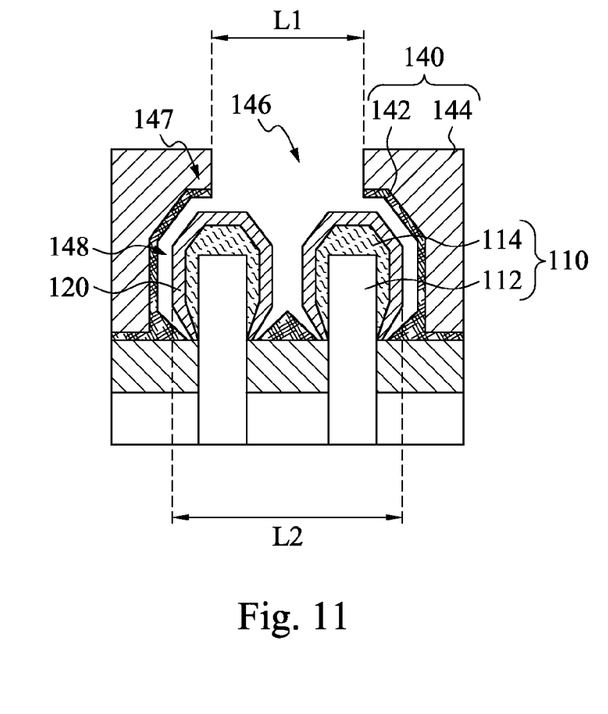

In FIG. 11, at least a portion of the sacrificial structure 130 is removed such that a portion of the epitaxy structure 120 is exposed. In various embodiments, the contour of the void space 148 is substantially defined by the shape of the sacrificial structure 130, so that the void space 148 includes the gap G between adjacent epitaxy structures 120, and the space between the dielectric layer 140 and the epitaxy structures 120. The void space 148 communicates with the opening 146. In some embodiments, as shown in FIG. 5, an overhanging portion 147 is formed in the dielectric layer 140, and the overhanging portion 147 adjoins the opening 146. In yet some embodiments, the traversing length L2 of the sacrificial structure 130 is substantially equal to a lateral length of the void space 148, which is greater than the length L1 of the opening 146. In yet some embodiments, the operation 22 of removing the sacrificial structure 130 includes performing a wet etching process. The etchant used in the wet etching process exhibits a high etching selectivity ratio of the sacrificial structure 130 to the epitaxy structure 120 so that most of the epitaxy structure 120 may be remained. Examples of the etchants include tetramethylammonium hydroxide (TMAH) solution, ammonia-hydrogen peroxide-water (APM) solution and the like.

According to some embodiments of the present disclosure, the sacrificial structure 130 includes silicon or Si-rich SiGe whereas the epitaxy structure 120 includes Ge-rich SiGeP. The difference in the Ge concentration between the epitaxy structure 120 and the sacrificial structure 130 allows the sacrificial structure 130 to be removed while the epitaxy structure 120 is remained. In some examples, the difference in Ge molar percentage between the epitaxy structure 120 and the sacrificial structure 130 is greater than about 10%, specifically greater than about 20%, more specifically greater than about 30%.

Figure 12:
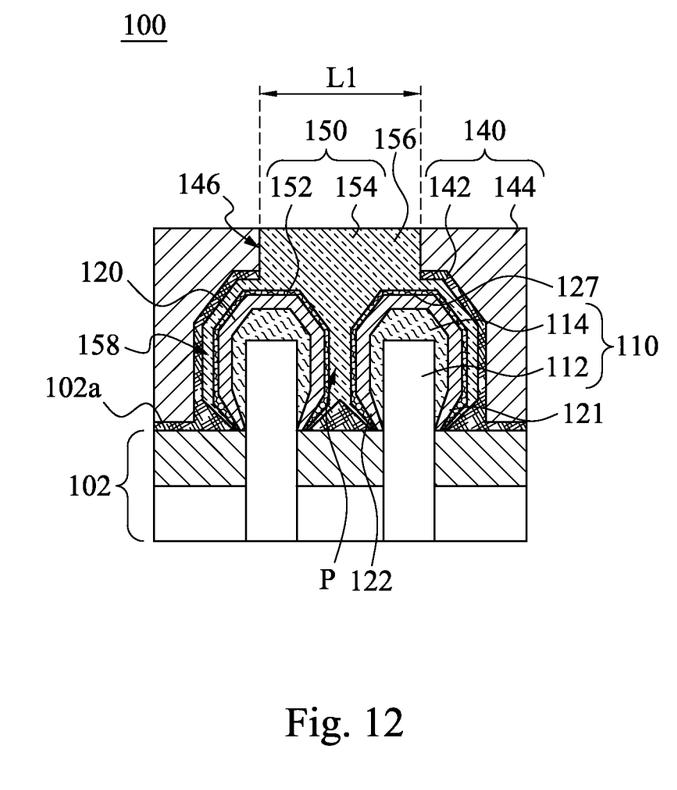

In FIG. 12, a contact structure 150 is formed on the exposed portion of epitaxy structure 120. Specifically, the contact structure 150 fills in the opening 146 and the space 148, and is in contact with the epitaxy structure(s) 120. In some embodiments, the contact structure 150 includes a number of silicide features (e.g., silicide layers) 152 and a conductive structure 154. Each silicide feature is disposed on a corresponding epitaxy structure 120. The conductive structure 154 is filled in the opening 146 and in contact with the silicide features 120. In specifics, the contact structure 150 may be fabricated by the following act: (i) performing a silicidation process to form a plurality of silicide features 152 each covering the exposed portion of a corresponding one of the epitaxy structures 120, in which two adjacent silicide features 152 are spaced apart from each other by an aperture P; and (ii) depositing the conductive structure 154 in the opening 146 and the aperture. According to various embodiments of the present disclosure, the contact structure 150 includes a trunk portion 156, a plurality of branch portions 158 and the silicide features 152. In some embodiments, each of the silicide features 152 covers a top surface of each epitaxy structure 120, such as seventh facet 127, and extends to the first and second facets 121, 122 of the epitaxy structure 120. In some examples, the silicide features 152 may encompass the periphery of the exposed portions of the epitaxy structures 120 in the space 148 (indicated in FIG. 11). Therefore, the contact area between the epitaxy structures 120 and the silicide features 152 may be advantageously increased. In some embodiments, the trunk portion 156 fills the opening 146, and thereby the length of the trunk portion 156 is substantially equal to the length L1 of the opening 148. Advantageously, the parasitic captaincy between the contact structure 150 and the gate structure may decreased because the length of the trunk portion 156 is decreased, as compared to conventional techniques. In some embodiments, the branch portions 158 extend from the trunk portion 156 and fill the space 148. The branch portions 158 further cap the silicide features 152. In some examples, the branch portions 158 enclose the silicide features 152, and thereby providing an enlarged contact area between the silicide features 152 and the branch portions 158 of the contact structure 150.

According to another aspect of the present disclosure, a semiconductor structure 100 is provided. As shown in FIG. 7 and FIG. 12, the semiconductor structure 100 includes a substrate 102, at least a fin structure 110, at least an epitaxy structure 120, a contact structure 150 and a dielectric layer 140. The semiconductor substrate 102 has a principal surface 102a. The fin structure 110 protrudes from the principal surface 102a. The epitaxy structure 120 covers the fin structure 110. The epitaxy structure 120 includes a first facet 121 and a second facet 122 positioned at opposite side of the epitaxy structure 120, and adjoining the principal surface 102a. Each of the first and second facets 121, 122 forms an acute angle with the principal surface 102a of the semiconductor substrate 102. The contact structure 150 includes a silicide feature, a trunk portion 156, and a plurality of branch portions 158. The silicide feature 152 covers a top surface of the epitaxy structure 120 and extends to the first and second facets 121, 122. The trunk portion 156 is disposed above the silicide feature 152. The branch portions 158 extend from the trunk portion 156, and further caps the silicide feature 152. The dielectric layer 140 covers a portion of the contact structure 150. The dielectric layer 140 has an opening 146 in which the trunk portion 156 is disposed.

In some embodiments, the first facet 121 and the second facet 122 have a (111) crystallographic orientation. In yet some embodiments, the branch portions cover the entire silicide feature. In yet some embodiments, the dielectric layer 140 has a housing space 148 (indicated in FIG. 5 and FIG. 11) under the opening 146. The housing space 148 communicates with the opening 146, and further the housing space is configured to accommodate the epitaxy structure 120, the silicide feature 152 and the branch portions 158.

Advantages of various embodiments of the present disclosure include providing a novel semiconductor structure and a novel method for manufacturing the semiconductor structure. The semiconductor structure provides improved contact characteristics and reduced parasitic capacitances. The method for manufacturing the semiconductor structure provides satisfactory process window to prevent the problems of source/drain loss.

In accordance with one aspect of some embodiments, a method of forming a semiconductor structure includes the following operations: (i) forming a fin structure on a substrate; (ii) epitaxially growing an epitaxy structure from the fin structure; (iii) forming a sacrificial structure surrounding the epitaxy structure, in which the sacrificial structure has a material different from a material of the epitaxy structure; (iv) forming a dielectric layer covering the sacrificial structure; (v) forming an opening passing through the dielectric layer to partially expose the sacrificial structure; (vi) removing a portion of the sacrificial structure to expose a portion of the epitaxy structure; and (vii) forming a contact structure in contact with the exposed portion of the epitaxy structure.

In accordance with another aspect of some embodiments, a method of forming a semiconductor structure includes the following operations: (i) forming a plurality of fin structures on a substrate; (ii) epitaxially growing a plurality of epitaxy structures each covering a corresponding one of the fin structures, wherein two adjacent ones of the epitaxy structures are spaced apart from each other by a gap; (iii) forming a sacrificial structure surrounding the epitaxy structures and filling the gap; (iv) forming a dielectric layer covering the sacrificial structure; (v) forming an opening passing through the dielectric layer to partially expose the sacrificial structure; (vi) removing a portion of the sacrificial structure to expose portions of the epitaxy structures such that the gap communicates with the opening; and (vii) forming a contact structure in contact with the exposed portions of the epitaxy structures.

In accordance with another aspect of some embodiments, a semiconductor structure includes a substrate, at least a fin structure, at least an epitaxy structure covering the fin structure, a contact structure and a dielectric layer. The substrate has a principal surface. The fin structure is coupled to the principal surface. The epitaxy structure covers the fin structure, in which the epitaxy structure includes a first facet and a second facet positioned at opposite side of the epitaxy structure and adjoining the principal surface. Each of the first and second facets forms an acute angle with the principal surface of the substrate. The contact structure includes a silicide feature, a trunk portion and a plurality of branch portions. The silicide feature covers a top surface of the epitaxy structure and extends to the first and second facets. The trunk portion is disposed above the silicide feature. The branch portions extend from the trunk portion and caps the silicide feature. The dielectric layer covers a portion of the contact structure, and the dielectric layer has an opening in which the trunk portion is disposed.

What is claimed is:

1. A method of forming a semiconductor structure, comprising:
    forming a first fin structure and a second fin structure on a substrate;
    epitaxially growing a first epitaxy structure and a second epitaxy structure respectively from the first and second fin structures, wherein the first epitaxy structure is spaced apart from the second epitaxy structure by a gap;
    epitaxially growing a first sacrificial structure and a second sacrificial structure respectively from the first and second epitaxy structures such that the first and second sacrificial structures are merged at the gap, and each of the first and second sacrificial structures has a material different from a material of the first and second epitaxy structures;
    forming a dielectric layer covering the first and second sacrificial structures;
    forming an opening passing through the dielectric layer to partially expose the first and second sacrificial structures;
    removing portions of the first and second sacrificial structures to expose portions of the first and second epitaxy structures; and
    forming a contact structure in contact with the exposed portions of the first and second epitaxy structures.

2. The method according to claim 1, wherein the first and second epitaxy structures comprise silicon germanium (SiGe) having a first germanium (Ge) molar percentage ranged from about 20% to about 80%.

3. The method according to claim 2, wherein the first and second sacrificial structures comprise silicon germanium having a second Ge molar percentage less than the first Ge molar percentage.

4. The method according to claim 3, wherein a difference between the first Ge molar percentage and the second Ge molar percentage is greater than 10%.

5. The method according to claim 1, wherein epitaxially growing the first and second sacrificial structures comprise epitaxially growing first and second silicon epitaxy structures.

6. The method according to claim 1, wherein removing the portions of the first and second sacrificial structures comprises performing a wet etching process to remove the portions of the first and second sacrificial structures.

7. The method according to claim 1, wherein removing the portions of the first and second sacrificial structures comprises forming void space between the dielectric layer and each of the first and second epitaxy structures.

8. The method according to claim 1, wherein forming the contact structure comprises:
   forming a silicide layer on the first and second epitaxy structures; and
   forming a conductive structure in the opening and on the silicide layer.

9. The method according to claim 1, wherein the first and second fin structures comprise P type semiconductor material.

10. The method according to claim 1, wherein each of the first and second fin structures comprise:
    an N-type fin made from a N-type semiconductor material; and
    a silicon phosphide layer epitaxially grown from the N-type fin.

11. A method of forming a semiconductor device, comprising:
    forming a plurality of fin structures on a substrate;
    epitaxially growing a plurality of epitaxy structures each covering a corresponding one of the fin structures, wherein each of the epitaxy structures includes a facet having a (110) crystalline orientation, and two adjacent ones of the epitaxy structures are spaced apart from each other by a gap;
    forming a sacrificial structure surrounding the epitaxy structures, wherein the sacrificial structure includes a portion extending from the facet having the (110) crystalline orientation of one of the epitaxy structures to the facet having the (110) crystalline orientation of an adjacent one of the epitaxy structures;
    forming a dielectric layer covering the sacrificial structure;
    forming an opening passing through the dielectric layer to partially expose the sacrificial structure;
    removing a portion of the sacrificial structure to expose portions of the epitaxy structures such that the gap communicates with the opening; and
    forming a contact structure in contact with the exposed portions of the epitaxy structures.

12. The method according to claim 11, wherein epitaxially growing the epitaxy structures comprises epitaxially growing a first silicon germanium (SiGe) epitaxy structure having a first germanium (Ge) molar percentage, and forming the sacrificial structure comprises epitaxially growing a second SiGe epitaxy structure having a second germanium (Ge) molar percentage that is less than the first Ge molar percentage.

13. The method according to claim 12, wherein a difference between the first germanium molar percentage and the second germanium molar percentage is greater than 10%.

14. The method according to claim 11, wherein epitaxially growing the epitaxy structures comprises epitaxially growing a SiGe epitaxy structure having a Ge molar percentage ranged from about 20% to about 80%, and forming the sacrificial structure comprises epitaxially growing a silicon epitaxy structure.

15. The method according to claim 11, wherein removing the sacrificial structure comprises creating a void space between the dielectric layer and a sidewall of one of the epitaxy structures.

16. The method according to claim 11, wherein forming the contact structure comprises:
    performing a silicidation process to form a plurality of silicide features each covering a corresponding one of the epitaxy structures, wherein two adjacent ones of the silicide features are spaced apart from each other by an aperture; and
    forming a conductive structure filled in the opening and the aperture.

17. A method of forming a semiconductor device, comprising:
    forming a plurality of fin structures on a substrate;
    epitaxially growing a plurality of epitaxy structures each covering a corresponding one of the fin structures, wherein two adjacent ones of the epitaxy structures are spaced apart from each other by a gap;
    forming a sacrificial structure surrounding the epitaxy structures, wherein the sacrificial structure includes a portion directly interconnected with said two adjacent ones of the epitaxy structures;
    forming a dielectric layer over the sacrificial structure, wherein the dielectric layer has an opening exposing a portion of the sacrificial structure;
    removing the sacrificial structure through the opening to form a void space surrounding the epitaxy structures and communicating with the opening; and
    forming a contact structure in the void space and in contact with the epitaxy structures.

18. The method according to claim 17, wherein epitaxially growing the epitaxy structures comprises epitaxially growing a first silicon germanium (SiGe) epitaxy structure having a first germanium (Ge) molar percentage, and forming the sacrificial structure comprises epitaxially growing a second SiGe epitaxy structure having a second Ge molar percentage that is less than the first Ge molar percentage.

19. The method according to claim 17, wherein forming the sacrificial structure comprises epitaxially growing a silicon epitaxy structure.

20. The method according to claim 17, wherein the gap has a width ranged from about 3 nm to about 30 nm.

* * * * *